United States Patent
Curran

(10) Patent No.: US 8,247,688 B2
(45) Date of Patent: Aug. 21, 2012

(54) FIBER PHOTOVOLTAIC DEVICES AND METHODS FOR PRODUCTION THEREOF

(75) Inventor: Seamus Curran, Pearland, TX (US)

(73) Assignee: University of Houston, Houston, TX (US)

( * ) Notice: Subject to any disclaimer, the term of this patent is extended or adjusted under 35 U.S.C. 154(b) by 514 days.

(21) Appl. No.: 12/473,089

(22) Filed: May 27, 2009

(65) Prior Publication Data

US 2010/0018579 A1  Jan. 28, 2010

Related U.S. Application Data

(60) Provisional application No. 61/056,135, filed on May 27, 2008.

(51) Int. Cl.
*H01L 31/0256* (2006.01)
*H01L 31/18* (2006.01)

(52) U.S. Cl. ............ 136/263; 136/261; 438/69; 438/82; 257/E21.09; 257/E31.127; 257/E31.003

(58) Field of Classification Search .................. 136/263; 438/82
See application file for complete search history.

(56) References Cited

U.S. PATENT DOCUMENTS

| 6,340,789 | B1 | 1/2002 | Petritsch et al. | |
|---|---|---|---|---|
| 7,535,019 | B1* | 5/2009 | Sager et al. | 257/43 |
| 7,618,838 | B2* | 11/2009 | Levitsky et al. | 438/82 |
| 2004/0056180 | A1 | 3/2004 | Yu | |
| 2004/0241900 | A1* | 12/2004 | Tsukamoto et al. | 438/82 |
| 2004/0250848 | A1* | 12/2004 | Sager et al. | 136/252 |
| 2005/0040374 | A1 | 2/2005 | Chittibabu | |
| 2005/0211294 | A1* | 9/2005 | Chittibabu et al. | 136/263 |
| 2006/0174934 | A1* | 8/2006 | Sager et al. | 136/256 |
| 2006/0272701 | A1* | 12/2006 | Ajayan et al. | 136/263 |
| 2009/0173372 | A1* | 7/2009 | Carroll et al. | 136/244 |

FOREIGN PATENT DOCUMENTS

WO  2007096085 A1  5/2007

(Continued)

OTHER PUBLICATIONS

Hu et al. Solar Cells: from Basic to Advanced Systems. New York: McGraw Hill Book Company, 1984. pp. 206-207.*

(Continued)

*Primary Examiner* — Jennifer Michener
*Assistant Examiner* — Magali P Slawski
(74) *Attorney, Agent, or Firm* — Winstead PC

(57) ABSTRACT

In various embodiments, fiber photovoltaic devices are described in the present disclosure. The fiber photovoltaic devices include an optical filament, a first electrode coating the optical filament, a continuous semiconductive layer deposited above the first electrode layer, and a second electrode layer deposited above the continuous semiconductive layer. The first electrode layer is at least partially transparent to electromagnetic radiation. The continuous semiconductive layer is in electrical contact with the first electrode layer. The continuous semiconductive layer absorbs electromagnetic radiation and turns the electromagnetic radiation into an electrical signal. The continuous semiconductive layer includes at least two semiconductive materials that are substantially unmixed and are located in separate regions along the longitudinal axis of the fiber photovoltaic device. The second electrode layer is in electrical contact with the continuous semiconductive layer. In various embodiments, photovoltaic collectors including a plurality of the fiber photovoltaic devices are described. In various embodiments, methods for production of fiber photovoltaic devices by a dip coating technique are described.

19 Claims, 4 Drawing Sheets

FOREIGN PATENT DOCUMENTS

| WO | WO 2007098378 A1 * | 8/2007 |
|----|----|----|
| WO | 2007130025 A1 | 11/2007 |
| WO | 2007130972 A2 | 11/2007 |
| WO | 2007130972 A3 | 11/2007 |

OTHER PUBLICATIONS

C.J. Brabec, et al., "Plastic Solar Cells", Adv. Functional Mats., 11, No. 1, pp. 15-26, (2001).

N.S. Sariciftci, et al., "Photoinduced Electron Transfer from a Conducting Polymer to Buckminsterfullerene", Science 258, pp. 1474-1476, (1992).

M. Reyes-Reyes, et al., "Meso-Structure Formation for Enhanced Organic Photovoltaic Cells", Organic Letters, 7, 26, pp. 5749-5752, (2005).

Vasiliev, et al., "Ab initio study of the self-assembly of phenosafranin on carbon nanotubes", Phys. Rev. B. 73, 165420 (2006).

S. Curran, et al., "OFC solar cell increases efficiency", SPIE, DOI: 10.1117/2.1200608.0324 (2006).

J. Xue, et al., "Asymmetric tandem organic photovoltaic cells with hybrid planar-mixed molecular heterojunctions", Applied Physics Letters, 85, 23, 5757 (2004).

H.W. Kroto, et al., "C60 : Buckminsterfullerene", Nature 318 (1985), pp. 162-163.

S. Curran, et al., "Dynamic electrical properties of polymer Carbon Nanotube Composites: Enhancement through covalent bonding", J. Mater. Res, 21, 4, 1071 (2006).

S. Curran, et al., "Thiolation of Carbon Nanotubes and Sidewall Functionalization", J. Mater. Res., 21, 4, 1012 (2006).

S. Curran, et al., "Composite from Poly(m-phenylenevinylene-co-2,5-dioctozy-p-phenylenevinylene) and Carbon Nanotubes: a Novel Material for Molecular Optoelectronics", Advanced Materials, 10 1091, (1998).

* cited by examiner

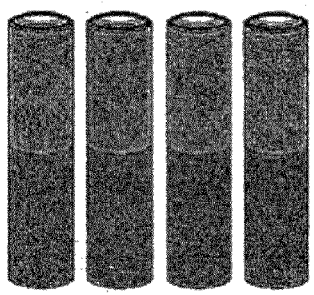 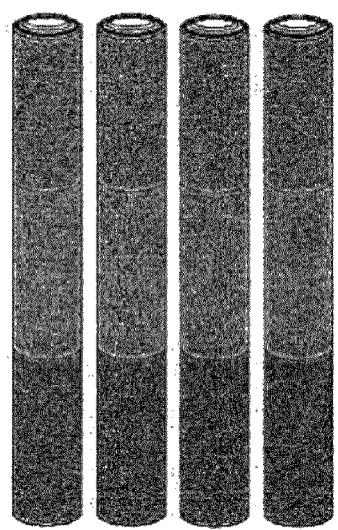 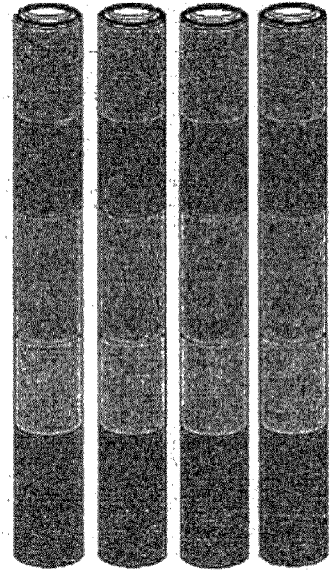
FIGURES 3A – 3C
FIGURE 3A    FIGURE 3B    FIGURE 3C

FIBER PHOTOVOLTAIC DEVICES AND METHODS FOR PRODUCTION THEREOF

This application claims priority to U.S. provisional patent application 61/056,135 filed May 27, 2008, which is incorporated by reference herein in its entirety.

STATEMENT REGARDING FEDERALLY SPONSORED RESEARCH

Not applicable.

BACKGROUND

Plastic (polymer) materials have received considerable attention as a new medium for use in photonic-based electronics for at least the last two decades. Photovoltaic devices such as, for example, solar cells convert electromagnetic radiation into electricity by producing a photo-generated current when connected across a load and exposed to light. Polymers and their composite derivatives have high commercial potential for use in such photovoltaic devices due to their favorable optical properties. First, certain polymers can convert almost all resonant light into energy through charge carrier generation. Second, the optical absorption of the polymers and their composite derivatives can be tailored to provide a desired bandgap. For instance, a bandgap of 1.1 eV is present in today's silicon-based photovoltaic devices. Third, simple and cost-effective production techniques are well established in the manufacturing arts for making polymer thin films.

Even though the first plastic solar cells were fabricated about twenty years ago, conversion efficiencies for polymer-based photovoltaic devices have yet to match those of inorganic thin film photovoltaic devices. Current polymer-based photovoltaic devices typically display conversion efficiencies of only slightly greater than 5%. In contrast, commercial photovoltaic devices utilizing crystalline or amorphous silicon commonly have conversion efficiencies greater than 20% for crystalline silicon and between 4 to 12% for amorphous silicon.

There are several reasons that polymer-based photovoltaic devices have failed to function at high efficiencies. A first reason is poor charge carrier transport. Although polymers and polymer composites can convert almost all resonant light into charge carriers (electrons, holes or excitons), carrier transport is generally poor. Poor charge carrier transport arises for at least the following two reasons: 1) Excitons travel only very short distances (typically about 50 nm) before being recombined; and 2) Polymer-based photovoltaic materials generally show poor carrier mobilities and conductivities. As a consequence of poor charge carrier transport, polymer-based photovoltaic devices have typically been fabricated from ultra-thin, semiconductive polymer films, typically less than about 250 nm. As a further consequence of having such ultra-thin, semiconductive polymer films, significant incident light upon the devices is lost due to transparency. Another substantial drawback of polymer-based photovoltaic devices is the propensity for polymer-based photovoltaic materials to undergo oxidative degradation. Accordingly, stringently-controlled assembly conditions and active device protection are often needed when working with the polymer-based photovoltaic materials. Finally, although the absorption range of polymer-based photovoltaic devices can be adjusted through chemical modification of the polymer or polymer composite, the absorption range of any given organic material is inherently limited to only certain regions of the electromagnetic spectrum. Accordingly, only a portion of the electromagnetic spectrum is capable of interacting with the photovoltaic device containing a given photovoltaic material.

Polymer-based photovoltaic devices have typically taken on the shape of a traditional flat panel array, which is commonly used in photovoltaic devices containing inorganic photovoltaic materials. In such flat panel polymer-based photovoltaic devices, an approach to overcome the narrow absorption range of polymer-based photovoltaic materials has entailed layering of different polymer materials on top of one another in order to broaden the absorption range. However, the layering approach is rather inefficient and provides only marginal improvement in polymer-based photovoltaic devices.

As completely different issues are associated with polymer-based photovoltaic materials compared to inorganic photovoltaic materials, it is apparent from the foregoing that a new approach and architecture for working with polymer-based photovoltaic devices would be of substantial benefit in the art. In the description set forth hereinbelow, new architectures and methods for preparing polymer-based photovoltaic devices as a fiber are described. These new architectures and methods overcome many of the limitations present in conventional polymer-based photovoltaic device configurations.

SUMMARY

In various embodiments, fiber photovoltaic devices are described herein. The fiber photovoltaic devices include an optical filament, a first electrode layer coating the optical filament, a continuous semiconductive layer deposited above the first electrode layer, and a second electrode layer deposited above the continuous semiconductive layer. The first electrode layer is at least partially transparent to electromagnetic radiation. The continuous semiconductive layer is in electrical contact with the first electrode layer. The continuous semiconductive layer absorbs electromagnetic radiation and turns the electromagnetic radiation into an electrical signal. The continuous semiconductive layer includes at least two semiconductive materials that are substantially unmixed and are located in separate regions along the longitudinal axis of the fiber photovoltaic device. The second electrode layer is in electrical contact with the continuous semiconductive layer.

In various embodiments, photovoltaic collectors including a plurality of fiber photovoltaic devices are described. The plurality of fiber photovoltaic devices are in electrical contact with an output circuit.

In other various embodiments, methods for preparing fiber photovoltaic devices are disclosed. The methods include the steps of: providing an optical filament; coating the optical filament with a first electrode layer; depositing a continuous semiconductive layer above the first electrode layer; and depositing a second electrode layer above the continuous semiconductive layer. The first electrode layer is at least partially transparent to electromagnetic radiation. The continuous semiconductive layer is in electrical contact with the first electrode layer. The continuous semiconductive layer absorbs electromagnetic radiation and turns the electromagnetic radiation into an electrical signal. The continuous semiconductive layer includes at least two semiconductive materials that are substantially unmixed and are located in separate regions along the longitudinal axis of the fiber photovoltaic device. The at least two semiconductive materials are deposited separately in a first dip coating step and a second dip coating step. The second electrode layer is in electrical contact with the continuous semiconductive layer.

The foregoing has outlined rather broadly various features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 3A-3C present illustrative schematic representations of several fiber photovoltaic device embodiments having continuous semiconductive layers formed from variable numbers of semiconductive materials;

DETAILED DESCRIPTION

Figure 1:
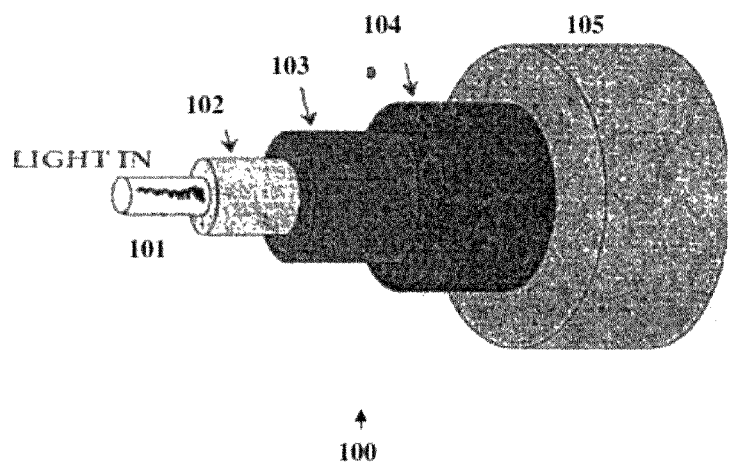
FIG. 1 presents a drawing of an illustrative polymer-based fiber photovoltaic device having a single-component semiconductive layer (prior art)

In the following description, certain details are set forth such as specific quantities, concentrations, sizes, etc. so as to provide a thorough understanding of the various embodiments disclosed herein. However, it will be apparent to those of ordinary skill in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

Referring to the drawings in general, it will be understood that the illustrations are for the purpose of describing particular embodiments of the disclosure and are not intended to be limiting thereto. Furthermore, drawings are not necessarily to scale.

While most of the terms used herein will be recognizable to those of ordinary skill in the art, it should be understood that when not explicitly defined, terms should be interpreted as adopting a meaning presently accepted by those of ordinary skill in the art.

One approach to overcoming the shortcomings of polymer-based materials in photovoltaic devices has been to arrange the photovoltaic device in a fiber configuration rather than in a flat panel configuration. FIG. 1 presents a drawing of an illustrative polymer-based fiber photovoltaic device 100 having a single-component semiconductive layer 104 (prior art). Semiconductive layer 104 is in electrical contact with optical filament 101 through first electrode layer 102. The first electrode layer 102 may be indium tin oxide, for example. The fiber photovoltaic device 100 also includes a conductive exciton-blocking layer 103, which assists in the band bending process between the active semiconductive layer 104 and first electrode layer 102. The exciton-blocking layer 103 limits the path length over which excitons can diffuse. Exciton-blocking layer 103 may be a polystyrenesulfonate-carbon nanotube composite, for example, which is highly semiconductive. Semiconductive layer 104 is further coated with second electrode layer 105, which may be aluminum, for example.

The fiber configuration shown in FIG. 1 possesses several advantageous over flat panel devices containing polymer-based photovoltaic materials, particularly problems associated with thin films necessary to efficiently remove poorly mobile excitons. Such issues include, for example, transparency to electromagnetic radiation. The fiber configuration shown in FIG. 1 advantageously removes generated excitons but not at a cost of increased transparency. Light is captured within optical filament 101 in a similar manner to that used in large scale optical concentrators, such that all resonant light is available for excition generation and charge removal. The fiber configuration also provides encapsulation, which protects the semiconductive layer 104 from oxidative degradation. Although the fiber configuration of FIG. 1 addresses known limitations of flat panel photovoltaic devices, the single-component device displays a limited conversion efficiency of only about 5%.

Figure 2:
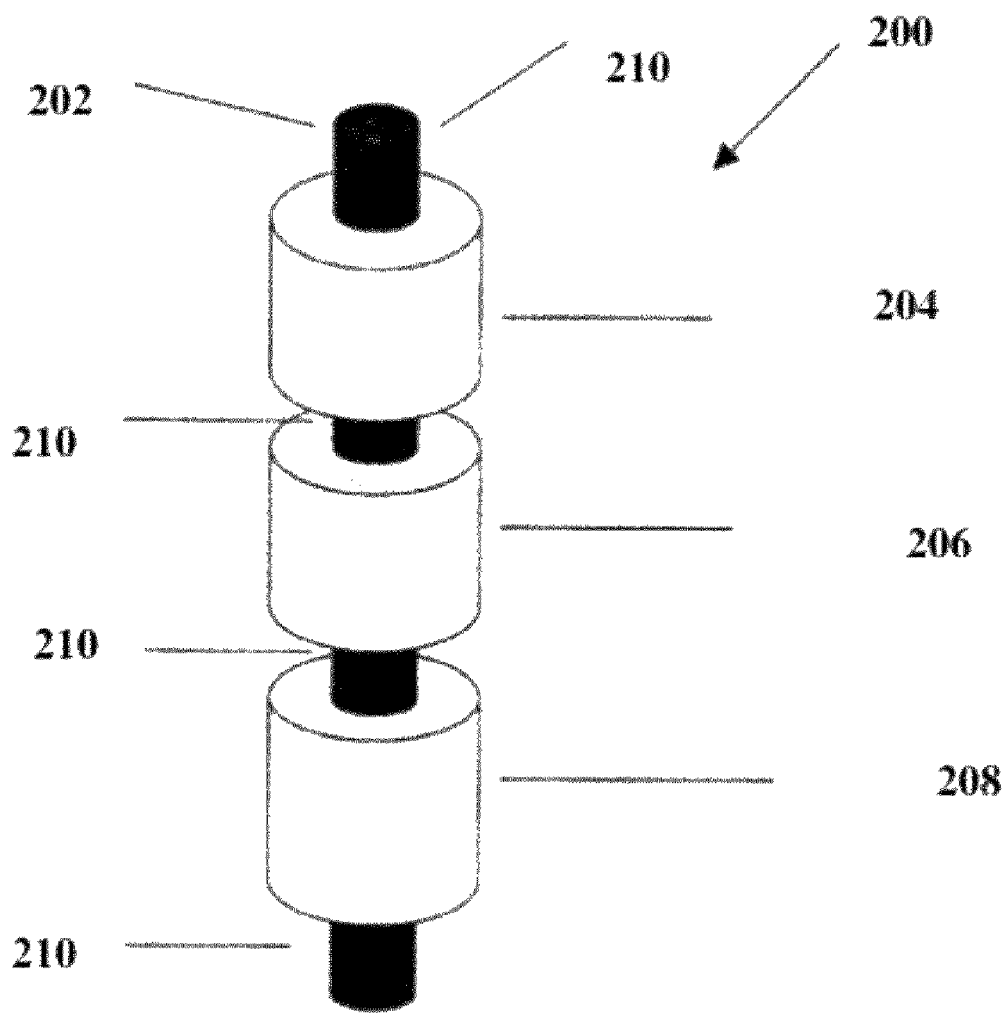
FIG. 2 presents a drawing of an illustrative fiber photovoltaic device having multiple polymer-based semiconductive components along a longitudinal axis of the fiber photovoltaic device (prior art)

Although the fiber photovoltaic device depicted in FIG. 1 addresses some of the known shortcomings of polymer-based photovoltaic devices, it does not overcome the limited absorption range of the polymer-based photovoltaic materials. Efforts to overcome the limited spectral absorption range of such materials have included either forming a plurality of polymer-based semiconductive layers or including multiple polymer-based semiconductive components in distinct regions of the fiber photovoltaic device. FIG. 2 presents a drawing of an illustrative fiber photovoltaic device 200 having multiple polymer-based semiconductive components (204, 206 and 208) along a longitudinal axis of the fiber photovoltaic device (prior art). Between the polymer-based semiconductive components 204, 206 and 208, optical filament 202 is coated with metal cladding 210 to promote internal reflection and minimize escape of electromagnetic radiation from within fiber photovoltaic device 200. Radiative losses in the regions not covered by polymer-based semiconductive components 204, 206 and 208 result in reduced efficiency.

The present disclosure describes a tandem architecture that allows a greater spectral overlap of polymer-based fiber photovoltaic devices with the solar spectrum by orienting multiple polymer-based semiconductors in a continuous linear fashion around a central optical filament. The multiple polymer-based semiconductors form a continuous semiconductive layer, but there is substantially no mixing or overlap of any of the polymer-based organic semiconductors with one another. The multiple polymer-based semiconductors can have unique profiles for absorption of electromagnetic radiation to allow for enhanced overlap with the solar spectrum in order to maximize solar absorption for maximized charge-carrying capacity. The absorption profiles can optionally include spectral overlap with one another in some embodiments. The tandem architecture advantageously allows the seamless use of multiple polymer-based semiconductors to broaden the spectral absorption range over that achieved with a single material. Due to increased spectral overlap with the sun, conversion efficiencies in excess of the present ~5% can be attained. By depositing the multiple polymer-based semiconductors in a continuous semiconductive layer, escape of electromagnetic radiation from the fiber photovoltaic devices is advantageously minimized.

In various embodiments, fiber photovoltaic devices are described herein. The fiber photovoltaic devices include an optical filament, a first electrode layer coating the optical filament, a continuous semiconductive layer deposited above the first electrode layer, and a second electrode layer deposited above the continuous semiconductive layer. The first electrode layer is at least partially transparent to electromagnetic radiation. The continuous semiconductive layer is in electrical contact with the first electrode layer. The continuous semiconductive layer absorbs electromagnetic radiation and turns the electromagnetic radiation into an electrical signal. Further, the continuous semiconductive layer includes at least two semiconductive materials that are substantially unmixed and are located in separate regions along the longitudinal axis of the fiber photovoltaic device. The second electrode layer is in electrical contact with the continuous semiconductive layer. In some embodiments, the second electrode layer is continuous.

FIGS. 3A-3C present illustrative schematic representations of several fiber photovoltaic device embodiments having continuous semiconductive layers formed from variable numbers of semiconductive materials. As presented in FIGS. 3A-3C, a plurality of fiber photovoltaic devices are shown together. Such groupings of the photovoltaic devices can be used to prepare a photovoltaic collector. The fiber photovoltaic devices shown in FIGS. 3A-3C are depicted before the application of a second electrode layer or any optional layers described hereinbelow. FIG. 3A depicts a two-component continuous semiconductive layer. FIG. 3B depicts a three-component continuous semiconductive layer. FIG. 3C depicts a five-component continuous semiconductive layer. One of ordinary skill in the art will recognize that the embodiments presented in FIGS. 3A-3C are meant to be illustrative only, and any number of components forming the continuous semiconductive layer may be used to operate within the spirit and scope of the present disclosure. Furthermore, the materials forming the continuous semiconductive layer may include further components as well, as described hereinbelow.

In various embodiments of the fiber photovoltaic devices, the band gap of the continuous semiconductive layer is about 1.1 eV. Such a band gap is comparable to that present in contemporary solar cell devices utilizing silicon.

In various embodiments of the fiber photovoltaic devices, the electromagnetic radiation absorbed includes, for example, infrared radiation, visible radiation, ultraviolet radiation and combinations thereof.

In various embodiments of the fiber photovoltaic devices, an absorption of electromagnetic radiation is maximized at an angle of incidence of about 15 degrees to about 40 degrees relative to the longitudinal axis of the fiber photovoltaic device. In some embodiments, the absorption of electromagnetic radiation is maximized at an angle of incidence of about 25 degrees. In various embodiments, the fiber face is perpendicular to the longitudinal axis of the fiber photovoltaic device. In various embodiments, the fiber face is at an angle relative to the longitudinal axis of the fiber (i.e., the fiber face is beveled). When the fiber face is beveled, a larger surface area for receipt of electromagnetic radiation is presented.

In any of the various embodiments of the fiber photovoltaic devices and methods for production thereof described herein, the optical filament may include a material such as, for example, glass, quartz, and polymers (plastic optical fibers). Polymers suitable for making plastic optical fibers include, for example, polymethyl methacrylate and perfluorocyclobutane-containing polymers. The optical filaments of the present disclosure have diameters ranging from about 1 µm to about 2 mm in some embodiments, from about 90 µm to about 1 mm in other embodiments, and from about 20 µm to about 800 µm in still other embodiments. Likewise, the optical filaments of the present disclosure have lengths ranging from about 500 nm to about 100 mm in some embodiments, from about 1 µm to about 1 mm in other embodiments, and from about 10 µm to about 100 µm in still other embodiments.

In any of the various embodiments of the fiber photovoltaic devices and methods for production thereof described herein, the optical filament can further include at least one upconverter. As used herein, an upconverter is a material operable to emit electromagnetic radiation at an energy greater than that absorbed by the upconverter. For example, upconverters of the present disclosure can absorb infrared radiation and emit visible or ultraviolet radiation. In various embodiments, upconverters of the present disclosure can include at least one lanthanide element such as, for example, erbium, ytterbium, dysprosium, holmium, and combinations thereof. In other various embodiments, upconverters that are organic compounds are disclosed. Such upconverting organic compounds include, for example, 1,8-naphthalimide derivatives, 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino) styryl]-1-methylpyridinium p-toluenesulfonate, 2-[ethyl[4-(nitrophenyl)ethenyl]phenylamino]ethanol, 4-dimethylamino-4'-nitrostilbene, Disperse Orange 25, Disperse Orange 3 and Disperse Red 1. In still other various embodiments, upconverters that are quantum dots are disclosed. Quantum dots include semiconductor materials such as, for example, cadmium selenide, cadmium telluride, zinc selenide, lead sulfide, cadmium sulfide, lead selenide, cadmium selenide, tellurium nanorods and selenium spheres.

In some embodiments of the disclosure, other or additional layers of the fiber photovoltaic devices may include any of the upconverters referenced hereinabove. For example, the first electrode layer or the continuous semiconductive layer may include an upconverter. Further, any optional layers of the fiber photovoltaic devices described hereinbelow may also include an upconverter.

In any of the various embodiments of the fiber photovoltaic devices and methods for production thereof described herein, the optical filaments may further include at least one scattering agent. According to present understanding of the embodiments of the present disclosure but without being bound by theory or mechanism, scattering agents disperse the incident electromagnetic radiation outward from the longitudinal axis of the optical filament, thereby facilitating absorption of the scattered radiation by the continuous semiconductive layer. In various embodiments, the scattering agents are metal nanoparticles. In various embodiments, the metal nanoparticles are transition metal nanoparticles. In various embodiments, the scattering agents have a diameter ranging from about 2 nm to about 50 nm.

In any of the various embodiments of the fiber photovoltaic devices and methods for production thereof described herein, the first electrode layer includes a conducting oxide such as, for example, indium tin oxide (ITO), gallium tin oxide, zinc indium tin oxide and combinations thereof. In various embodiments, the first electrode layer is ITO. In other various embodiments, the first electrode layer includes a conducting polymer such as, for example, poly(acetylene)s, poly(pyrrole)s, poly(thiophene)s, poly(aniline)s, poly(parapyridine)s, poly(fluorene)s, poly(3-alkylthiophene)s, poly(tetrathiafulvalene)s, poly(naphthalene)s, poly(p-phenylene sulfide)s, poly(para-phenylene vinylene)s, and poly(para-pyridyl vinylene)s. In various embodiments, the first electrode layer includes polyaniline. In various embodiments, the first electrode layer includes poly(3,4-ethylenedioxythiophene) (PEDOT). In various embodiments, optional charge carriers or dopants (n- or p-type) can be added to the conducting polymers to increase their conductivity.

In still other various embodiments, the first electrode layer can include a conductive composite material. For example, the conductive composite material can include carbon nanotubes, fullerenes and combinations thereof dispersed in a polymer phase to make the composite material conductive. In some embodiments, the polymer phase of the composite material is non-conductive, while in other embodiments, the polymer phase is conducting prior to including the carbon nanotubes or fullerenes. In still additional various embodiments, the first electrode layer can be a metal or metal alloy.

The first electrode layer can have thickness of about 10 nm to about 1 μm in some embodiments, about 100 nm to about 900 nm in other embodiments, and about 200 nm to about 800 nm in still other embodiments.

In any of the various embodiments of the fiber photovoltaic devices and methods for production thereof described herein, the continuous semiconductive layer is formed from at least two polymer-based semiconductive materials. In various embodiments, the at least two semiconductive materials include a polymer and a filler material. In some embodiments, the polymer is a p-type material and the filler is an n-type material. One of ordinary skill in the art will recognize that the absorption profile of the fiber photovoltaic devices may be tuned to various parts of the electromagnetic spectrum based on a knowledge of the absorption profiles of the at least two semiconductive materials. In various embodiments, the filler material is used to tune the absorption properties of the fiber photovoltaic devices. Furthermore, the filler material may also influence the electron transport properties within the fiber photovoltaic devices.

In various embodiments, the polymer of the at least two polymer-based semiconductive materials can be, for example, poly(acetylene)s, poly(pyrrole)s, poly(thiophene)s, poly(aniline)s, poly(parapyridine)s, poly(fluorene)s, poly(3-alkylthiophene)s, poly(tetrathiafulvalene)s, poly(naphthalene)s, poly(p-phenylene sulfide)s, poly(para-phenylene vinylene)s, poly(para-pyridyl vinylene)s and combinations thereof. In some embodiments, the polymer can be, for example, poly(3-hexylthiophene) ($P_3HT$), poly(3-octylthiophene) ($P_3OT$), poly[2-methoxy-5-(2'-ethylhexyloxy-p-phenylene vinylene)] (MEH-PPV), poly[2-methoxy-5-(3,7-dimethyloctyloxy)-p-phenylene vinylene], sodium poly[2-(3-thienyl)-ethoxy-4-butylsulfonate] (PTEBS) and combinations thereof. In some embodiments, the polymer can be a co-polymer such as, for example, poly[(m-phenylene vinylene)-co-(2,5-dioctyloxy-p-phenylene vinylene)] (PmPV). PmPV is particularly advantageous due to its propensity for forming well dispersed carbon nanotube polymer composites.

In any of the various embodiments of the fiber photovoltaic devices and methods for production thereof described herein, the filler material of the polymer-based semiconductive materials can include, for example, carbon nanotubes, fullerenes, quantum dots and combinations thereof. In various embodiments, the filler material is carbon nanotubes. Further description of the carbon nanotubes is set forth hereinbelow. In various embodiments, the filler material is a fullerene material. Illustrative fullerene materials include, for example, $C_{60}$, $C_{70}$ and higher fullerenes $C_{76}$, $C_{78}$, $C_{82}$ and $C_{84}$. Derivatized fullerenes such as, for example, 1-(3-methoxycarbonyl)propyl-1-phenyl(6,6)-$C_{61}$ (PCBM-$C_{60}$) and 1-(3-methoxycarbonyl)propyl-1-phenyl(6,6)-$C_{71}$ (PCBM-$C_{70}$) may be used as a filler material in various embodiments of the present disclosure. In some embodiments of the disclosure, PCBM-$C_{70}$ is particularly advantageous due to the better photoconductive properties of $C_{70}$ relative to that of $C_{60}$, in addition to its smaller bandgap and lower propensity to fluoresce. In various embodiments, the filler material is a quantum dot material. Illustrative quantum dot compositions for the filler material include, for example, lead sulfide, cadmium telluride, cadmium sulfide, lead selenide, cadmium selenide, tellurium nanorods and selenium spheres.

In various embodiments, the at least two semiconductive materials are both nanocomposites. In some embodiments, a first semiconductive material is a $P_3HT$:PCBM $C_{70}$ nanocomposite and a second semiconductive material is a nanocomposite of PmPV doped with carbon nanotubes.

In any of the various embodiments described herein, carbon nanotubes may be formed by any known technique and can be obtained in a variety of forms, such as, for example, soot, powder, fibers, bucky paper and mixtures thereof. The carbon nanotubes may be any length, diameter, or chirality as produced by any of the various production methods. In some embodiments, the carbon nanotubes have diameters in a range between about 0.1 nm and about 100 nm. In some embodiments, the carbon nanotubes have lengths in a range between about 100 nm and about 1 μm. In some embodiments, the chirality of the carbon nanotubes is such that the carbon nanotubes are metallic, semimetallic, semiconducting or combinations thereof. Carbon nanotubes may include, but are not limited to, single-wall carbon nanotubes (SWNTs), double-wall carbon nanotubes (DWNTs), multi-wall carbon nanotubes (MWNTs), shortened carbon nanotubes, oxidized carbon nanotubes, functionalized carbon nanotubes, purified carbon nanotubes, and combinations thereof. One of ordinary skill in the art will recognize that many of the embodiments described herein using a particular type of carbon nanotube may be practiced within the spirit and scope of the disclosure using other types of carbon nanotubes.

In any of the various embodiments presented here, the carbon nanotubes may be unfunctionalized or functionalized. Functionalized carbon nanotubes, as used herein, refer to any of the carbon nanotube types bearing chemical modification, physical modification or combination thereof. Such modifications can involve the nanotube ends, sidewalls, or both. Illustrative chemical modifications of carbon nanotubes include, for example, covalent bonding and ionic bonding. Illustrative physical modifications include, for example, chemisorption, intercalation, surfactant interactions, polymer wrapping, salvation, and combinations thereof. Unfunctionalized carbon nanotubes are typically isolated as aggregates and are referred to as ropes or bundles, which are held together through van der Waals forces. The carbon nanotube aggregates are not easily dispersed or solubilized. Chemical modifications, physical modifications, or both can provide individualized carbon nanotubes through disruption of the van der Waals forces between the carbon nanotubes. As a result of disrupting van der Waals forces, individualized carbon nanotubes may be dispersed or solubilized.

In various embodiments, functionalized carbon nanotubes are functionalized with organic dyes that absorb in the infrared, visible, or ultraviolet region of the electromagnetic spectrum, or a combination thereof. Such functionalized carbon nanotubes advantageously provide for charge transfer from the non-conducting dye medium to the carbon nanotubes, which are conducting. Hence, enhanced absorption of electromagnetic radiation and conversion to electricity can be realized using dye-functionalized carbon nanotubes in the fiber photovoltaic devices.

Unfunctionalized carbon nanotubes may be used as-prepared from any of the various production methods, or they may be further purified. Purification of carbon nanotubes typically refers to, for example, removal of metallic impurities, removal of non-nanotube carbonaceous impurities, or both from the carbon nanotubes. Illustrative carbon nanotube purification methods include, for example, oxidation using oxidizing acids, oxidation by heating in air, filtration and chromatographic separation. Oxidative purification methods remove non-nanotube carbonaceous impurities in the form of carbon dioxide. Oxidative purification of carbon nanotubes using oxidizing acids further results in the formation of oxidized, functionalized carbon nanotubes, wherein the closed ends of the carbon nanotube structure are oxidatively opened and terminated with a plurality of carboxylic acid groups. Illustrative oxidizing acids for performing oxidative purification of carbon nanotubes include, for example, nitric acid, sulfuric acid, oleum and combinations thereof. Oxidative purification methods using an oxidizing acid further result in removal of metallic impurities in a solution phase. Depending on the length of time oxidative purification using oxidizing acids is performed, further reaction of the oxidized, functionalized carbon nanotubes results in shortening of the carbon nanotubes, which are again terminated on their open ends by a plurality of carboxylic acid groups. The carboxylic acid groups in both oxidized, functionalized carbon nanotubes and shortened carbon nanotubes may be further reacted to form other types of functionalized carbon nanotubes. For example, the carboxylic acid groups may be reacted with organic dye molecules.

In any of the various embodiments of the fiber photovoltaic devices and methods for production thereof described herein, the second electrode layer is formed from a metal or metal alloy. In various embodiments, the second electrode layer is formed from a material such as, for example, gold, silver, copper, aluminum and combinations thereof. In some embodiments, the second electrode layer is aluminum. The second electrode layer has a thickness ranging from about 10 nm to about 10 µm in some embodiments, from about 100 nm to about 1 µm in other embodiments, and from about 200 nm to about 800 nm in still other embodiments.

In any of the various embodiments of the fiber photovoltaic devices and methods for production thereof described herein, the fiber photovoltaic devices further include a LiF layer between the continuous semiconductive layer and the second electrode layer. In some embodiments, the thickness of the LiF layer is about 5 angstroms to about 10 angstroms. In some embodiments, the LiF layer is less than about 5 angstroms in thickness. LiF enhances the efficiency of photovoltaic energy conversion in the fiber photovoltaic devices. In some embodiments, the LiF layer is at least partially oxidized to form a layer of mixed LiF and $Li_2O$. In some embodiments, the LiF layer is completely oxidized to $Li_2O$.

In any of the various embodiments of the fiber photovoltaic devices and methods for production thereof described herein, the fiber photovoltaic devices further include an exciton-blocking layer between the first electrode layer and the continuous semiconductive layer. In various embodiments, the exciton-blocking layer is a carbon nanotube-polymer composite. In some embodiments, the exciton-blocking layer is semiconductive. In various embodiments, the exciton-blocking layer assists in the band bending process between the first electrode layer and the continuous semiconductive layer. In various embodiments, the exciton-blocking layer limits the path length over which excitons can diffuse. In various embodiments, the exciton-blocking layer may additionally act to fill pinhole gaps or shorting defects in the first electrode layer.

In various embodiments, the exciton-blocking layer is formed from a polystyrenesulfonate/carbon nanotube polymer composite (PSS/nanotube composite). In the PSS/nanotube composite, a styrene monomer is attached to a dithiocarboxylic ester-functionalized carbon nanotube, and the appended styrene is then polymerized to form the PSS/nanotube composite. In such embodiments, the carbon nanotubes are chemically bonded to the polymer matrix. In some embodiments, the carbon nanotubes of the PSS/nanotube composite are MWNTs. In some embodiments, the carbon nanotubes of the PSS/nanotube composite are SWNTs.

In other various embodiments, the exciton-blocking layer is formed from a composite material having carbon nanoparticles dispersed in a 3,4-polyethylenedioxythiophene:polystyrenesulfonate copolymer or a poly(vinylidene chloride) polymer or copolymer. In various embodiments, the carbon nanoparticles are, for example, SWNTs, MWNTs, fullerenes and combinations thereof.

In any of the various embodiments of the fiber photovoltaic devices and methods for production thereof described herein, the fiber photovoltaic devices further include a protective layer coating the second electrode layer. In some embodiments, the protective layer is a polymeric material. In some embodiments, the protective layer is a composite material. The protective layer provides increased durability to the fiber photovoltaic devices and inhibits oxidative degradation of the fiber photovoltaic device components.

Any of the various layers of the fiber photovoltaic devices described herein may be deposited by any known deposition technique. For example, the layers may be deposited through techniques such as, for example, sputtering, dip coating, spin coating, vapor phase deposition, vacuum thermal annealing, and combinations thereof. In various embodiments of the fiber photovoltaic devices, the at least two semiconductive materials of the continuous semiconductive layer are applied by a dip coating technique. In various embodiments, the dip coating technique can include sequential steps to form the continuous semiconductive layer in a stepwise manner.

In other various embodiments of the present disclosure, photovoltaic collectors are described. The photovoltaic collectors include a plurality of fiber photovoltaic devices that are in electrical contact with an output circuit. Each of the plurality of fiber photovoltaic devices includes an optical filament, a first electrode coating the optical filament, a continuous semiconductive layer deposited above the first electrode layer, and a second electrode layer deposited above the continuous semiconductive layer. The first electrode layer is at least partially transparent to electromagnetic radiation. The continuous semiconductive layer is in electrical contact with the first electrode layer. The continuous semiconductive layer absorbs electromagnetic radiation and turns the electromagnetic radiation into an electrical signal. Further, the continuous semiconductive layer includes at least two semiconductive materials that are substantially unmixed and are located in separate regions along the longitudinal axis of the fiber photovoltaic device. The second electrode layer is in electrical contact with the continuous semiconductive layer. In some embodiments, the second electrode layer is continuous.

In various embodiments of the photovoltaic collectors, the plurality of fiber photovoltaic devices includes at least about 1,000 fiber photovoltaic devices. In other various embodiments of the photovoltaic collectors, the plurality of fiber photovoltaic devices includes at least about 10,000 fiber photovoltaic devices. In some embodiments, the output circuit includes a battery. In some embodiments, the output circuit includes electrical wiring.

In still other various embodiments of the present disclosure, methods for preparing fiber photovoltaic devices are disclosed. The methods include the steps of: providing an optical filament, coating the optical filament with a first electrode layer, depositing a continuous semiconductive layer above the first electrode layer, and depositing a second electrode layer above the continuous semiconductive layer. The first electrode layer is at least partially transparent to electromagnetic radiation. The continuous semiconductive layer is in electrical contact with the first electrode layer. The continuous semiconductive layer absorbs electromagnetic radiation and turns the electromagnetic radiation into an electrical signal. The continuous semiconductive layer includes at least two semiconductive materials that are substantially unmixed and are located in separate regions along the longitudinal axis of the fiber photovoltaic device. The at least two semiconductive materials are deposited separately in a first dip coating step and a second dip coating step. The second electrode layer is in electrical contact with the continuous semiconductive layer.

In various embodiments, the methods further include depositing an exciton-blocking layer between the first electrode layer and the continuous semiconductive layer. In various embodiments, the methods further include depositing a LiF layer between the continuous semiconductive layer and the second electrode layer. In various embodiments, the methods further include depositing a protective layer over the second electrode layer. Further disclosure concerning the various optional layer is set forth as described hereinabove.

EXPERIMENTAL EXAMPLES

The following experimental examples are included to demonstrate particular aspects of the present disclosure. It should be appreciated by those of skill in the art that the methods described in the examples that follow merely represent exemplary embodiments of the disclosure. Those of skill in the art should, in light of the present disclosure, appreciate that many changes can be made in the specific embodiments described and still obtain a like or similar result without departing from the spirit and scope of the present disclosure.

Spectral Characterization: Characterization of the fiber photovoltaic devices and nanocomposite materials was conducted as described below. Initial analysis at the macroscale was carried out using UV-Vis Absorption, fluorescence and photoluminescence spectroscopies. These techniques give detailed information regarding the bulk properties of the nanocomposites in terms of their electronic response. Fluorescence and photoluminescence techniques allow differentiation to be made between singlet and triplet states generated in the excited levels before recombination. For nanocomposites containing carbon nanotubes, Raman spectroscopy was also utilized, since this technique is well established for characterization of carbon nanotubes. Raman spectral methods also circumvent having to use an STM to perform individual nanotube analyses.

Carrier Transport Characterization: Electrical characterization was first carried out using a two-point probe sandwich technique. Using this method, the semiconductor is sandwiched between two high workfunction metal electrodes to measure the AC and DC conduction properties. The dimensionality of generated charge carriers can be determined using low temperature measurements and measuring the slope of the resistance as a function of temperature. The space charge limited current generated in the nanocomposites at high voltages can be determined by examining the slope of the current as a function of temperature. This feature is representative of the overall bulk charge carrier mobility.

Electrical characterization was also carried out using van der Pauw's method. The van der Pauw's technique is used to determine the sheet resistance and the charge carrier density present in the polymer/carbon nanotube composites in an ideal clover leaf geometry. Combining resistivity and Hall measurements in the van der Pauw's method enables the determination of both the mobility and sheet density of p- and n-type charge carriers.

Electrical characterization was also carried out using time of flight methods. This method is particularly useful for assessing poorly mobile carriers, such as those that occur in fullerene-based semiconductors containing $PCBM-C_{60}$ and $PCBM-C_{70}$, for example. In such cases, the charge carriers are highly localized before moving from one hopping site to the next. Hence, Hall mobility measurements may not be sufficiently sensitive in these cases. Time of flight measurements provide information regarding whether the hopping transport mechanism is caused by a tunneling or a phonon-assisted process. The carrier specificity can also be measured by switching the polarity of the electrodes and measuring the electron or hole mobilities.

Example 1

Fabrication of a Fiber Photovoltaic Device Having a Single-Component Continuous Semiconductive Layer A fiber photovoltaic device (cell) having $P_3HT$ as the semiconductive layer was fabricated, and optical absorption measurements were performed on the cell. The device was built around an optical filament having a core diameter of 400 μm. Indium tin oxide (ITO) was deposited atop the optical filament. A layer of $P_3HT$ was then coated onto the ITO layer. Finally, Al was coated on to the $P_3HT$ polymer surface until the entire polymer surface was coated. The cell was irradiated using a white light source where the light propagated into the fiber at varying angles and the transmitted light at the end of the fiber was captured using a microparts absorption spectrometer. The spectral absorption was then determined as a function of the incident angle of the light input upon the cell. The absorption maxima of the cell occurred around 500 nm to 525 nm, which is consistent with previous measurements on $P_3HT$. The maximum spectral absorption occurred at an incident angle of about 20 degrees relative to the fiber face.

Example 2

Fabrication of a Fiber Photovoltaic Device Having a Two-Component Continuous Semiconductive Layer An optical filament having a diameter of 200 μm was coated with a film of ITO to a surface conductivity of 10 ΩSq. The ITO was thereafter annealed to improve film morphology while maintaining transparency. An exciton-blocking layer formed from a polystyrenesulfonate/carbon nanotube composite was coated to a thickness of 100 nm over the ITO layer.

Figure 4:
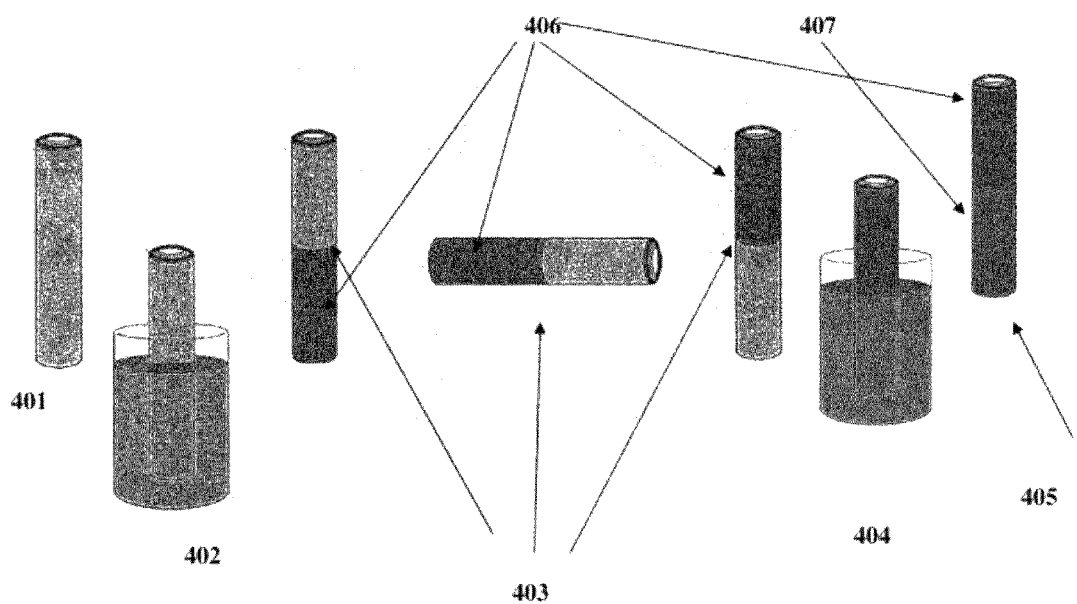
FIG. 4 presents a schematic representation of an illustrative dip coating technique used in the fabrication of an embodiment of the fiber photovoltaic devices.

A continuous semiconductive layer was then applied by a dip coating technique. FIG. 4 presents a schematic representation of an illustrative dip coating technique used in the fabrication of an embodiment of the fiber photovoltaic devices. As shown in FIG. 4, fiber precursor 401 (an optical fiber coated with an ITO layer and an exciton-blocking layer) was dipped in a first liquid medium 402 to deposit a first portion 406 of the semiconductive layer. In the non-limiting embodiment shown, the first portion 406 of the semiconductive layer was deposited on to the exciton-blocking layer of the fiber photovoltaic device by dip coating a portion of fiber precursor 401 in a first liquid medium 402 comprising a $P_3HT/PCBM-C_{70}$ nanocomposite. After dipping, partially-coated fiber 403 was brought out of the first liquid medium 402 and thermally treated with RF coils at about 150° C. to harden the composite. To form the two-component continuous semiconductive layer, the partially-coated fiber 403 was spun around and dipped on its opposite end in a second liquid medium 404 comprising a PmPV-carbon nanotube semiconductor composite to form coated fiber 405 having the second portion 407 of the semiconductive layer in substantially continuous contact with the first portion 406 of the semiconductive layer. Thermal treatment was carried out as above to harden the second composite component.

After coating of the two-component continuous semiconductive layer was completed, coated fiber 405 was coated with LiF to a thickness of 0.5 nm. Finally, an outer electrode of aluminum was applied over the LiF layer. An optional layer of organic resin can be applied over the outer electrode of aluminum to protect the electrode from oxidative damage.

From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting the scope of the disclosure, which is defined in the following claims.

What is claimed is the following:

1. A fiber photovoltaic device, said fiber photovoltaic device comprising:
   an optical filament;
   a first electrode layer coating the optical filament;
      wherein the first electrode layer is at least partially transparent to electromagnetic radiation;
   a continuous semiconductive layer deposited above the first electrode layer;
      wherein the continuous semiconductive layer is in electrical contact with the first electrode layer;
      wherein the continuous semiconductive layer absorbs electromagnetic radiation and turns the electromagnetic radiation into an electrical signal; and
      wherein the continuous semiconductive layer comprises at least two semiconductive materials;
         wherein the at least two semiconductive materials comprise a nanocomposite comprising a polymer and a filler material, and a first semiconductive material comprises a $P_3HT:PCBM$ $C_{70}$ nanocomposite and a second semiconductive material comprises a nanocomposite comprising PmPV doped with carbon nanotubes;
         wherein the at least two semiconductive materials are substantially unmixed and are located in separate regions along the longitudinal axis of the fiber photovoltaic device; and
   a second electrode layer deposited above the continuous semiconductive layer;
      wherein the second electrode layer is in electrical contact with the continuous semiconductive layer.

2. The fiber photovoltaic device of claim 1, wherein the band gap of the first semiconductive material is about 1.1 eV.

3. The fiber photovoltaic device of claim 1, further comprising an exciton-blocking layer between the first electrode layer and the continuous semiconductive layer.

4. The fiber photovoltaic device of claim 3, wherein the exciton-blocking layer comprises a carbon nanotube-polymer composite.

5. The fiber photovoltaic device of claim 1, further comprising a LiF layer between the continuous semiconductive layer and the second electrode layer.

6. The fiber photovoltaic device of claim 1, further comprising a protective layer coating the second electrode layer.

7. The fiber photovoltaic device of claim 1, wherein the optical filament comprises a material selected from the group consisting of glass, quartz, and a polymer.

8. The fiber photovoltaic device of claim 1, wherein the first electrode layer comprises a conducting oxide selected from the group consisting of indium tin oxide, gallium tin oxide, zinc indium tin oxide, and combinations thereof.

9. The fiber photovoltaic device of claim 1, wherein the electromagnetic radiation is selected from the group consisting of visible radiation, infrared radiation, ultraviolet radiation and combinations thereof.

10. The fiber photovoltaic device of claim 1, wherein the at least two semiconductive materials comprise polymer-based semiconductors.

11. The fiber photovoltaic device of claim 1, wherein the filler material comprises carbon nanotubes.

12. The fiber photovoltaic device of claim 11, wherein the carbon nanotubes are functionalized.

13. The fiber photovoltaic device of claim 12, wherein the carbon nanotubes are functionalized with at least one organic dye;
   wherein the at least one organic dye absorbs in a region of the electromagnetic spectrum selected from the group consisting of the infrared region, the visible region, the ultraviolet region, and combinations thereof.

14. The fiber photovoltaic device of claim 1, wherein the filler material comprises quantum dots.

15. The fiber photovoltaic device of claim 1, wherein the second electrode layer comprises a material selected from the group consisting of gold, silver, copper, aluminum and combinations thereof.

16. The fiber photovoltaic device of claim 1, wherein an absorption of electromagnetic radiation is maximized at an angle of incidence of about 15 degrees to about 40 degrees relative the longitudinal axis of the fiber photovoltaic device.

17. The fiber photovoltaic device of claim 16, wherein the absorption of electromagnetic radiation is maximized at an angle of incidence of about 25 degrees.

18. The fiber photovoltaic of claim 1, wherein the at least two semiconductive materials comprising the continuous semiconductive layer are applied by a dip coating technique.

19. A photovoltaic collector comprising a plurality of fiber photovoltaic devices as recited in claim 1, wherein the plurality of fiber photovoltaic devices are in electrical contact with an output circuit.

* * * * *